United States Patent [19]

Strong

[11] Patent Number: 4,851,715
[45] Date of Patent: Jul. 25, 1989

[54] SCHOTTKY-CLAMPED TRANSISTOR LOGIC BUFFER CIRCUIT

[75] Inventor: Bob D. Strong, Garland, Tex.

[73] Assignee: Texas Instruments Incorporated, Dallas, Tex.

[21] Appl. No.: 287,682

[22] Filed: Dec. 20, 1988

Related U.S. Application Data

[63] Continuation of Ser. No. 185,232, Apr. 18, 1988, abandoned, which is a continuation of Ser. No. 851,055, Apr. 11, 1986, abandoned.

[51] Int. Cl.[4] .................... H03K 19/088; H03K 5/12; H03K 3/01
[52] U.S. Cl. .................... 307/456; 307/458; 307/263; 307/270
[58] Field of Search ............ 307/270, 254, 446, 263, 307/268, 458

[56] References Cited

FOREIGN PATENT DOCUMENTS 0134549 10/1979 Japan .................... 307/458

OTHER PUBLICATIONS

I.B.M. Tech. Disc. Bul. "Three-State Push-Pull Driver" Gani and Montegari.

Horowitz and Hill "The Art of Electronics" Cambridge University Press 1980, p. 77.

Primary Examiner—Stanley D. Miller
Assistant Examiner—M. R. Wambach
Attorney, Agent, or Firm—Michael E. Melton; Thomas W. DeMond; Melvin Sharp

[57] ABSTRACT

A high speed interstage STL buffer (27) is disclosed having a low threshold and high driving capability. A first Schottky-clamped grounded emitter transistor (28) receives input signals through a Schottky steering diode (38) and inverts the input signal. The input signal is applied in parallel through a Schottky steering diode (20) to a second Schottky-clamped grounded emitter transistor (12). The collector (22) of the second transistor (12) provides an output of the buffer (27) for driving load current in one direction with respect to the buffer output. A third transistor (40) connected as an emitter follower has the emitter (42) thereof connected to the buffer output for driving load currents in the other direction. The base (46) of the emitter follower transistor (40) is coupled by a Schottky steering diode (50) to the collector (32) of the first transistor (28). The steering diodes (20, 38, 50) have a forward threshold voltage less than that of the Schottky-barrier diodes used to clamp the base-collector junctions of the first and second transistors (28, 12).

11 Claims, 1 Drawing Sheet

SCHOTTKY-CLAMPED TRANSISTOR LOGIC BUFFER CIRCUIT

This application is a continuation of application Ser. No. 185,232 filed Apr. 18, 1988, now abandoned, which is a continuation of Ser. No. 851,055, filed Apr. 11, 1986, now abandoned.

TECHNICAL FIELD OF THE INVENTION

The present invention relates in general to logic circuits, and more particularly relates to Schottky-clamped transistor logic circuits.

BACKGROUND OF THE INVENTION

Continued progress is being made in the integrated circuit technology with respect to higher speed switching circuits and more functions per chip. As a result, many integrated circuit chips now include plural functions, ranging in order of a magnitude greater number of functions than integrated circuits of a decade ago.

The Schottky Transistor Logic (STL) family of digital circuits represents a recent development in the integrated circuit technology for providing increased circuit speed and reduced supply voltage requirements. A Schottky-clamped or metal barrier junction in parallel with a transistor base-collector junction prevents the bipolar transistor from becoming saturated, thereby reducing base storage times and increasing switching speeds. Despite the improved circuit speed of this family of logic, the increased density of circuits within a chip can offset the advantage of higher switching speeds, thus negating the use of nonsaturating STL circuits. This is especially true when a logic gate or buffer must drive a large number of other circuits within the chip. As the output of a driving circuit is fanned out to a number of inputs of other circuits, the capacitive loading on the driving circuit is increased, thus degrading the operation of the STL circuits. The added capacitance is attributed in general to the stray capacitance between the interconnecting metallic conductors and the substrate, as well as to the junction capacitance of diodes and transistors connected to such conductors.

With the use of STL circuits as heretofore known, the circuit parameter most affected by stray load capacitance is the rise time of the waveform produced by the output of the driving circuit. Typical STL circuits, and particularly interstage buffer circuits, are constructed with an output driving structure having a pull-up resistor. As a consequence, the time constant in which the stray load capacitance can be charged to a particular level is directly related to the value of the pull-up resistor and the value of distributed capacitance. It can be seen that as the number of circuits driven by a buffer circuit increases, the output rise time thereof is correspondingly degraded.

From the foregoing, it may be seen that a need has arisen for an improved interstage buffer for driving multiple circuits in an integrated circuit chip. An associated need has arisen for an interstage driver circuit which has an output rise time parameter essentially independent of the nature of the capacitive load.

BRIEF DESCRIPTION OF THE DRAWINGS

Further features and advantages of the present invention will become apparent from the description of an illustrative embodiment thereof, taken in conjunction with the accompanying drawings, in which.

SUMMARY OF THE INVENTION

In accordance with the present invention, an interstage logic buffer circuit is provided which substantially reduces or eliminates the shortcomings associated with the corresponding prior art circuits.

In accordance with the interstage buffer circuit of the invention, a first transistor is provided with a Schottky-clamped base-collector junction, which transistor is connected to the circuit input by a Schottky steering diode. A bias resistor is connected between a supply voltage and a base of the first transistor.

A second transistor is also provided with a Schottky-clamped base-collector junction, which second transistor includes a bias resistor and a Schottky steering diode connected in a manner identical to that of the first transistor. The cathodes of the Schottky steering diodes associated with the first and second transistors are both connected to the circuit input. The first and second transistors operate in the grounded emitter configuration, while the collector of the second transistor is connected to the buffer circuit output.

A third transistor is provided and operates in an emitter follower configuration, the emitter thereof being connected to the buffer circuit output. The collector of the third transistor is connected to a supply voltage. In addition, a bias resistor and a Schottky steering diode are connected to the base of the third transistor, with the cathode of the Schottky steering diode connected to the collector of the first transistor.

Each of the three Schottky steering diodes is fabricated so as to have a forwardthreshold voltage less than that of the Schottky-clamped base-collector junctions of the first and second transistors.

The STL buffer circuit of the invention provides all of the advantages of high speed STL circuits, and is additionally capable of driving interstage capacitive loads with signal rise times which are essentially independent of the load capacitance.

DETAILED DESCRIPTION OF THE INVENTION

Figure 1:
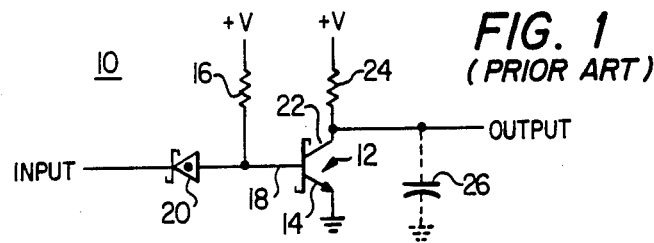
FIG. 1 is an electrical schematic drawing of an STL buffer logic circuit constructed in accordance with prior art techniques.

FIG. 1 illustrates an STL buffer circuit 10 constructed in accordance with the prior art. The STL buffer comprises a transistor 12 operating in the grounded emitter 14 configuration. The transistor 12 is fabricated with a Schottky-clamped base-collector junction. The input bias circuit includes a bias resistor 16 connected to the base 18 of the transistor 12, and a Schottky steering diode 20 connecting the transistor base 18 to the buffer input. The cathode of steering diode 20 is poled toward the buffer circuit input. The transistor collector 22 provides the output of the buffer circuit 10, which output is pulled up to a supply voltage +V by pull-up resistor 24. The stray or distributed circuit capacitance which the transistor 12 output drives is designated by reference character 26.

The operation of the buffer circuit of FIG. 1 is characterized by the logic inversion function provided by transistor 12. When a logic high signal is applied to the input of the buffer circuit 10, diode 20 is reversed biased, and thus bias current is applied through the bias resistor 16 to the transistor base 18. The transistor 12 is thus placed in a conductive state, whereby collector current is drawn from the capacitive load 26 into the buffer circuit 10, and then to circuit ground through the transistor emitter 14. When transistor 12 is in a conductive state, its impedance is on the order of a few ohms and thus the fall time transition of the signal on the buffer output is very small. The distributed circuit capacitance 26 can thus be discharged very quickly through the low impedance of the transistor 12.

In contrast, when the signal on the buffer input is at a logic low, steering diode 20 becomes forward biased and transistor 12 is placed in its nonconductive state. As a result, the buffer output is driven through a rise time transition to a logic high level. This output transition to the logic high level is a consequence of current flowing from supply voltage +V through the pull-up resistor 24, thereby charging the distributed circuit capacitance 26. Because the resistance of the pull-up resistor 24 is much larger than the output impedance of the transistor 12 when in its conductive state, the distributed circuit capacitance 26 is charged at a slower rate. Hence, the rise time transition of the buffer output is longer than the fall time transition of the signal. In addition, as the distributed capacitance 26 increases, due to the buffer circuit driving additional loads, the rise time deteriorates in a corresponding manner.

As noted above, the high speed operation of the STL circuit of FIG. 1 arises from the nonsaturating characteristic provided by the Schottky-clamped base-collector transistor junction. Enhanced speed is also attributed to the fast recovery of the Schottky diode 20. The Schottky diode 20 also lowers the signal amplitude swing on the base 18 of transistor 12, and thus permits the operation of the buffer circuit 10 at lower input voltages, and thus corresponding lower supply voltages. It can be seen that while the choice of a Schottky-clamped transistor 12 provides enhanced speeds in logic circuits, the advantages of such circuits may not be fully realized when the distributed capacitance on the output thereof becomes sizable.

Figure 2:
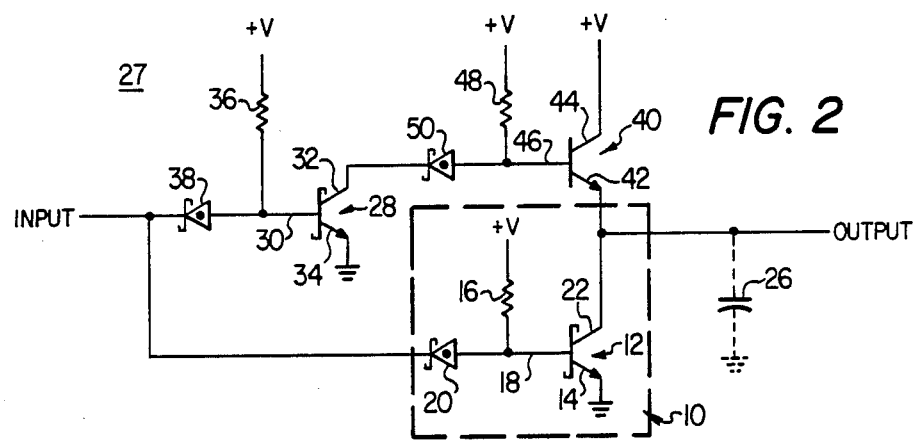
FIG. 2 is an electrical schematic drawing of an STL buffer circuit constructed in accordance with the principles and concepts of the present invention.
Figure 3:
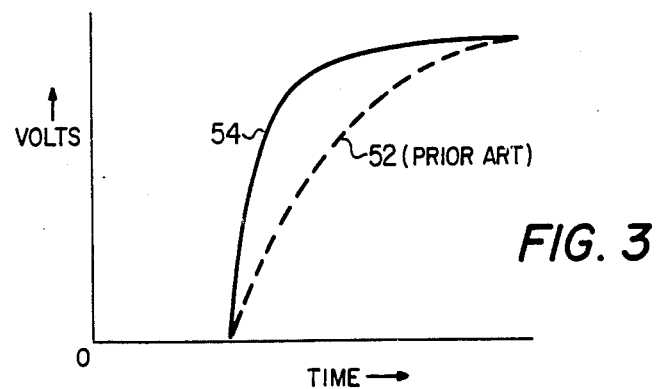
FIG. 3 graphically depicts the output signal rise times of the buffer circuit of FIG. 1 and the buffer circuit according to the invention.

The principles and the concepts of the present invention are best understood by referring to FIGS. 2 and 3 of the drawings. In FIG. 2 there is illustrated an STL buffer 27 according to the invention. The circuit 10 enclosed by the dashed line essentially constitutes the buffer circuit 10 shown in FIG. 1. Identical reference characters are employed in FIGS. 1 and 2 to denote similar circuit structures.

The improvement according to the invention includes a first NPN bipolar transistor 28 with a Schottky-clamped base-collector junction. The base and collector terminals are designated by respective reference characters 30 and 32. The emitter 34 is grounded. A bias resistor 36 is provided between a supply voltage +V and the transistor base 30. The anode of a Schottky steering diode 38 is connected to the transistor base 30, while the cathode thereof is connected to the buffer circuit input. The transistor 28 and its associated input bias circuit is thus substantially identical to the structure identified by reference character 10. The cathode of steering diode 38 is connected in common to the cathode of steering diode 20, and also to the buffer input. The Schottky-clamped NPN bipolar transistor 12 will hereinafter generally be referred to in this description as the second transistor of the improved buffer circuit 27.

A third NPN bipolar transistor 40 is connected to the circuit in an emitter follower configuration. The output of the transistor 40 is thus taken from the emitter terminal 42, rather than from the collector terminal 44. Thus, the emitter 42 of the third transistor 40 is connected in common with the collector 22 of the second transistor 12, and in common with the buffer circuit output. The rapid charging and discharging of the distributed circuit capacitance 26 is effected by respective third and second transistors 40 and 12. Because transistor 40 operates in an emitter follower configuration, it does not become saturated when driven into its conductive state by typical circuit signals. As a result, it is not necessary that the base-collector junction of the third transistor 40 be clamped by a Schottky-barrier diode to prevent saturated transistor operation. If it is desired to construct the third transistor 40 with a Schotrky-clamped base-collector junction, the circuit performance as described herein will not be substantially affected.

Continuing with the description of the buffer circuit 27 of FIG. 2, the collector 44 of the third transistor 40 is connected to a supply voltage +V. The transistor base 46 is connected to a bias resistor 48 and to the anode of a Schottky steering diode 50. The other terminal of the bias resistor 48 is connected to a supply voltage +V, while the cathode of the Schottky diode 50 is connected to the collector 32 of the first transistor 28.

In order to provide extremely low circuit threshold voltages, Schottky diodes 20, 38 and 50 are constructed to have a forward threshold voltage less than that of the Schottky-barrier diodes that clamp the base-collector junctions of the first and second transistors 28 and 12. This is accomplished by fabricating the diodes 20, 38 and 50 with a titanium-tungsten (TIW) metal semiconductor junction. This aspect is noted in the drawings by a dot within the body of the diodes. The base-collector junctions of the first and second transistors 28 and 12, on the other hand, are constructed using platinum silicide. As a consequence, the forward threshold voltage of the diodes 20, 38 and 50 will be about 350 mv, while the forward threshold voltage of the transistor base-collector junction will be about 600 mv. It can be seen from conventional circuit analysis that by using steering diodes 20 and 38, with low forward threshold voltages, only a small signal voltage change on the circuit input is required to drive the output thereof to a different logic level. A circuit analysis will also show that the signal amplitude on the bases 18 and 30 of respective transistors 12 and 28 is reduced by using diodes with reduced forward voltage characteristics.

The operation of tne STL buffer circuit 27 of FIG. 2 is described below. When a logic high signal is applied to the input of the buffer circuit 27, steering diodes 20 and 38 become reversed biased. Current thus flows from the supply voltage +V through bias resistors 16 and 36 to the respective bases 18 and 30 of transistors 12 and 28. Transistors 12 and 28 are each placed in a conductive state, and thus in a low output impedance condition. As noted above, when transistor 12 is in a conductive state, the distributed circuit capacitance 26 discharges rapidly and becomes collector current to transistor 12. The capacitance 26 becomes discharged very quickly, and the fall time transition of the output signal is very short.

When the first transistor 28 is in its conductive state as a result of the logic high on the buffer input, steering diode 50 is forward biased. Current flows from the +V supply voltage through the bias resistor 48 and through diode 50. Because the combined voltage of the forward biased diode 50 and the collector-emitter voltage of transistor 28 are insufficient to forward bias the base-emitter junction of transistor 40, the latter transistor remains in a nonconductive state. Transistor 40 thus does not affect the operation of the second transistor 12 in rapidly discharging the distributed circuit capacitance 26.

When the logic level on the buffer circuit input is driven to a logic low, steering diodes 20 and 38 become forward biased. The base-emitter voltage of the first and second transistors 28 and 12 is thereby insufficient to drive such transistors into a conduction state. As a result, second transistor 12 is cut off, thereby isolating it from either the third transistor 40 or the distributed circuit capacitance 26 connected to the buffer circuit output. When first transistor 28 is nonconducting, or cut off by the input logic low, no current path is provided through steering diode 50. It can be seen that the first transistor 28 functions as an inverter with respect to the signal received by the third transistor 40 to prevent both transistors 12 and 40 from being in the conductive state at the same time. Base current is applied to the third transistor 40 through bias resistor 48. Transistor 40 then conducts collector-emitter current from the +V supply. The collector current of transistor 40 is a multiple of the base current thereof, by a factor of the current gain $H_{fe}$ of the third transistor 40. When in the conductive state, the emitter 42 of transistor 40 represents only a small output impedance, thereby applying a large current to the buffer output to quickly charge the distributed circuited capacitance 26.

It can be appreciated that from the construction of the buffer circuit 27, the current gain of the third transistor 40 allows the distributed circuit capacitance 26 to charge at a rate which is essentially independent of the load capacitance value. This is in marked contrast with the prior art STL circuits where the charging of the distributed circuit capacitance 26 was substantially dependent on the value of the pull-up resistor 24.

With regard to the buffer circuit 27, the abundant supply of current from transistor 40 for charging the distributed circuit capacitance 26 permits the rising transition of the signal on the circuit output to be significantly shortened. A relative comparison of the rise times of the buffer circuit outputs of FIG. 1 and FIG. 2 is graphically depicted in FIG. 3. The respective horizontal and vertical axes of the graph correspond to time and voltage parameters. The waveform identified by reference character 52 is indicative of the rise time produced on the output of the prior art buffer circuit 10 of FIG. 1. Waveform 54 is a comparative illustration of the output rise time produced by the buffer circuit 27 according to the invention. It can be seen that the RC time constant of the waveform 54 is significantly improved over that of the waveform 54 produced by the prior art circuit. The improved rise time characteristic of the buffer circuit 27 of FIG. 2 is due primarily to the current gain provided by the third transistor 40. While the supply of base current to transistor 40 through bias resistor 48 is somewhat affected by the junction capacitances of the diode 50 and transistor 40, such effects are minimal compared to the effects produced by the much larger distributed circuit capacitances 26.

The invention has been described in terms of a buffer inverter logic circuit. However, the principles of the invention can be easily implemented to form other logic functions. For example, with the addition of a pair of diodes a NAND circuit function can be realized. The anodes of the respective added diodes would be connected to the anodes of respective steering diodes 20 and 38. The cathodes of the added diodes would be connected in common and provide a second input to the circuit of FIG. 2. A logic low or either circuit input would drive the output to a logic high, thereby providing the logic NAND function.

From the foregoing an improved STL circuit has been provided. The advantages provided by the first and third transistors in combination with the respective bias circuits have not been realized in STL circuits previously known. Moreover, the symmetry of the first, second and third transistor circuits provides enhanced fabrication advantages. The symmetry aspect is defined without regard to the values of the various components, such as the resistance values of the bias resistors. While the preferred embodiment of the invention has been disclosed in connection with NPN type of bipolar transistors, the principles and concepts can be applied with equal effectiveness to PNP transistor technologies. For example, those skilled in the art may prefer to provide a PNP buffer circuit by substituting transistors 12, 28 and 40 with PNP transistors, by reversing the polarity of the diodes 20, 38 and 50 and by providing a negative supply voltage −V.

Therefore, while the preferred embodiment of the invention has been disclosed with reference to a specific buffer circuit, it is to be understood that many changes in detail may be made as a matter of engineering choices without departing from the scope of the invention as defined by the appended claims.

What is claimed is:

1. A high speed logic buffer circuit, comprising:
   an input for receiving signals thereon for driving the buffer circuit;
   an output for driving other electrical apparatus;
   a first transistor having a Schottky-clamped base and collector junction and having an emitter, said base being driven by signals on said input, and said collector being connected to a potential for allowing collector and emitter current to flow, with its emitter directly connected to ground;
   a second transistor having a Schottky-clamped base and collector junction, and having an emitter connected to ground allowing collector and emitter current flow, the collector of said second transistor being connected to said output for allowing current flow in a first direction with respect to said output, the base of said second transistor receiving said input signals; and
   a third transistor having a base driven by signals on the collector of said first transistor, an emitter connected to said output and a ollector connected to a potential for allowing current to flow in a second direction opposite to said first direction with respect to said output.

2. The buffer circuit of claim 1 further including a first Schottky diode connected between said input and the base of said first transistor.

3. The buffer circuit of claim 2 further including a second Schottky diode connected between said input and the base of said second transistor.

4. The buffer circuit of claim 3 wherein the forward threshold voltage of each said first and second diodes is less than the forward threshold voltage of the base and collector junctions of the respective first and second transistors.

5. The buffer circuit of claim 1 wherein the collector of said second transistor is connected directly to the emitter of said third transistor.

6. The buffer circuit of claim 1 further including a Schottky diode connected between the collector of said first transistor and the base of said third transistor.

7. The buffer of claim 1 further including means for operating said buffer circuit between a ground potential and about 2 volts.

8. A Schottky transistor buffer circuit, comprising:
a first input for receiving input driving signals;
an output for supplying bidirectional currents to a load;
a first bipolar transistor having a Schottky-clamped base-collector junction and an emitter directly connected to ground, and further including a first Schottky diode with an anode connected to the base of said first transistor and a cathode connected to said input, and a bias resistor connected between a source of voltage and the base of said first transistor;

a second bipolar transistor having a Schottky-clamped base-collector junction, a grounded emitter, and including a second Schottky diode with an anode connected to the base of said second transistor and a cathode connected to said input, and further including a resistor connected between a source of voltage and the base of said second transistor, the collector of said second transistor being connected to said output; and a third transistor having a collector connected to a source of voltage, an emitter connected to said output, a base, and including a third Schottky diode with an anode connected to the base of said third transistor and a cathode connected to the collector of said first transistor, and further including a resistor connected between a source of voltage and the base of said third transistor.

9. The buffer circuit of claim 8 wherein said first, second and third Schottky diodes each include a forward threshold voltage less than the Schottky-clamped base-collector junction of said first transistor.

10. The buffer circuit of claim 8 wherein said source of voltage is about 2 volts.

11. The buffer of claim 1 further including a resistor directly connected between a voltage potential and the base of said second transistor to drive said second transistor in an on condition.

* * * * *